United States Patent
Miyazaki

(10) Patent No.: US 10,242,841 B2
(45) Date of Patent: Mar. 26, 2019

(54) SPECIMEN HOLDER

(71) Applicant: Mel-Build Corporation, Fukuoka-shi (JP)

(72) Inventor: Hiroya Miyazaki, Fukuoka (JP)

(73) Assignee: Mel-Build Corporation, Fukuoka (JP)

( * ) Notice: Subject to any disclaimer, the term of this patent is extended or adjusted under 35 U.S.C. 154(b) by 45 days.

(21) Appl. No.: 15/716,942

(22) Filed: Sep. 27, 2017

(65) Prior Publication Data

US 2018/0096817 A1     Apr. 5, 2018

(30) Foreign Application Priority Data

Oct. 3, 2016   (JP) ................. 2016-195475

(51) Int. Cl.
  *H01J 37/20*   (2006.01)
  *H01J 37/26*   (2006.01)

(52) U.S. Cl.
  CPC ............. *H01J 37/20* (2013.01); *H01J 37/26* (2013.01); *H01J 2237/2001* (2013.01); *H01J 2237/2002* (2013.01); *H01J 2237/204* (2013.01); *H01J 2237/2005* (2013.01); *H01J 2237/2007* (2013.01)

(58) Field of Classification Search
  USPC ................ 250/442.11, 441.11, 440.11, 443.1
  See application file for complete search history.

(56) References Cited

U.S. PATENT DOCUMENTS

| | | | |
|---|---|---|---|
| 9,010,202 B2* | 4/2015 | Stabacinskiene | G01N 23/20033 250/443.1 |
| 2015/0170873 A1* | 6/2015 | Miyazaki | H01J 37/20 250/442.11 |
| 2015/0340199 A1* | 11/2015 | Nagakubo | H01J 37/20 250/443.1 |

FOREIGN PATENT DOCUMENTS

| | | |
|---|---|---|
| JP | S48-042449 U | 5/1973 |
| JP | H2-312147 | 12/1990 |
| JP | 2001-234346 | 8/2001 |
| JP | 2004-053571 | 2/2004 |
| JP | 2004-363085 | 12/2004 |

(Continued)

OTHER PUBLICATIONS

Office Action received in priority application No. JP2016-195475, dated Jan. 24, 2017.

*Primary Examiner* — Kiet T Nguyen
(74) *Attorney, Agent, or Firm* — ALG Intellectual Property, LLC

(57) ABSTRACT

The purpose of the present invention is to provide a specimen holder having a structure capable of maintaining a seal surface regardless of a change of environment. A specimen holder according to the present invention is characterized by comprising a specimen holder axis part having a specimen and/or a specimen mesh setting part, an external cylinder part capable of housing the specimen holder axis part, and a seal part for sealing the specimen and/or the specimen mesh setting part from atmosphere wherein the seal part is (Continued)

set to a step part which is set to a portion of the external cylinder part. Further, in a referred embodiment of a specimen holder according to the present invention, it is characterized in that the seal part set to the step part is as a first seal part, further the specimen holder has a second seal part which exists in a tip part of the specimen holder and exists in a direction of a central axis of an electron microscope comparing to the specimen and/or the specimen mesh setting part.

9 Claims, 2 Drawing Sheets

(56) References Cited

FOREIGN PATENT DOCUMENTS

| | | |
|---|---|---|
| JP | 2009-021592 | 1/2009 |
| JP | 2012-518898 | 8/2012 |
| JP | 2015-153566 | 8/2015 |
| JP | 2015-153710 | 8/2015 |
| WO | WO-2014/002700 | 1/2014 |

* cited by examiner

[Figure 1]
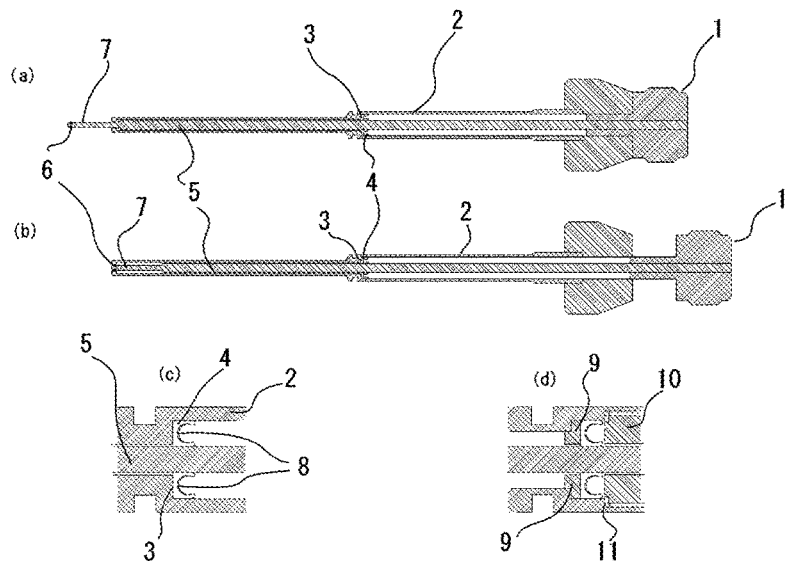
[Figure 2]
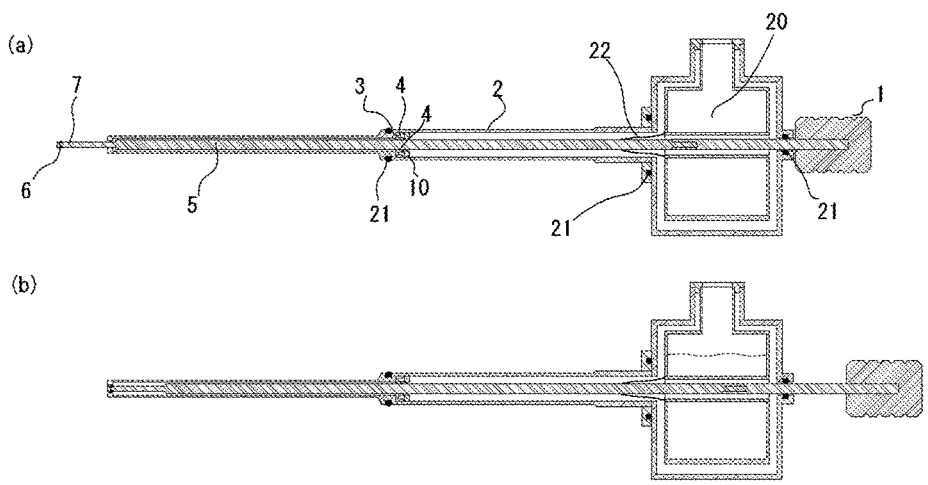

[Figure 3]
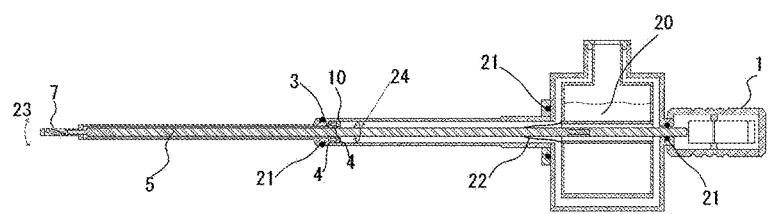

SPECIMEN HOLDER

FIELD OF THE INVENTION

The present invention relates to a specimen holder, and particularly relates to a specimen holder having a favorable characteristic of seal under a more severe condition.

BACKGROUND

In recent years, in a material analysis field, an effect by a specimen segment (Hereinafter, referred to as a specimen segment.) it for an electron microscope such as a transmission electron microscope (TEM) being exposed to atmosphere is discussed (an effect by oxidization caused by atmosphere, or adsorption of a slight amount of materials existing in atmosphere etc.). Therefore, an importance is began to be recognized that a specimen segment should be transferred to an electron microscope such as a transmission electron microscope (TEM) without a specimen being exposed to atmosphere to conduct an observation by TEM.

For example, in a holder for TEM, in particular, a transport holder for shielding atmosphere (Hereinafter, referred to as a transfer holder) is a holder wherein a seat portion for fixing a specimen segment is stored into an external cylinder portion of the holder to keep away the specimen from an outside air environment. Usually, an O-ring contacts with an inside surface of a support portion for supporting a specimen holder to be used with the aim of sealing air-tightly between the support portion and the specimen holder (Patent literature 1).

PRIOR ART LITERATURE

Patent Literature

Patent literature 1: JP-A-2015-153566

PROBLEMS TO BE RESOLVED BY THE INVENTION

Including the above literature 1, however, in the specimen holder in the prior art, there is possibility that a leak occurs on a holder axis since an O-ring become kinked which is set in an usual arrangement if the holder axis is droved backward and forward. The leak from a holder axis makes a vacuum of device (TEM) worse. A general O-ring is not better suited for a slide or rotation. Since it is very difficult to use a special rubber O-ring having a strong resistance for a slide to a TEM holder wherein a diameter of axis is small, a general round O-ring is used. However, there are some problems that an O-ring wrenches when sliding, since a linear of the O-ring also become deservingly small.

In the worst case, it causes a breakdown of device. Moreover, there is a possibility that the leak from a holder axis have an influence on a specimen segment in a chamber. Other than the above mentioned case, the leak from a holder axis also occurs in the case that a contact of a seal of O-ring is weak or become weak regardless of what the cause may be. Further, because a damage of specimen should be reduced, an emphasis is on an observation under cooling and in these years, a transport for shielding atmosphere under cooling condition has been needed.

However, when a general O-ring is used, the O-ring is froze by a liquid nitrogen cooling and thereby going off an ability of sealing. Moreover, a metal is also simultaneously constricted by cooling, it was absolutely impossible to seal when cooling.

Therefore, in order to transport a specimen with shielding atmosphere under cooling condition, it has been needed to store it with an another chamber. (Since a seal of an O-ring is not workable), although it is possible, it has been needed to provide a vacuum gate to the end part (a portion which is not able to enter into an electron microscope) of a holder structurally. In order to store the holder in such a structure, a length of a holder become two times or more comparing with that of a normal holder. By such structure, since it is impossible to work in a glove box wherein a specimen is generally set when transporting a specimen with shielding atmosphere, it is extremely inconvenient. Moreover, since it is needed to draw into a degree of a piece of a holder axis, there is some issue that a guide axis is strained. Therefore, in order to transport a specimen with shielding atmosphere under cooling condition, the important thing is that only a tip part is stored and a method of shielding atmosphere certainly is desired.

Therefore, in order to solve the above problems, an object of the present invention is to provide a specimen holder having a structure capable of maintaining a seal surface regardless of the environment

SUMMARY

In order to achieve the above object, as a result of analyzing a various sort of seal members, the present inventors have come to find the present invention.

That is, a specimen holder according to the present invention is characterized by comprising a specimen holder axis part having a specimen and/or a specimen mesh setting part, an external cylinder part capable of housing the specimen holder axis part, and a seal part for sealing the specimen and/or the specimen mesh setting part from atmosphere wherein the seal part is set to a step part which is set to a portion of the external cylinder part.

Further, in a preferred embodiment of a specimen holder according to the present invention, it is characterized in that the seal part set to the step part is as a first seal part, further the specimen holder has a second seal part which exists in a tip part of the specimen holder and exists in a direction of a central axis of an electron microscope comparing to the specimen and/or the specimen mesh setting part.

Further, in a preferred embodiment of a specimen holder according to the present invention, it is characterized in that the seal part has an elastic member inside and the elastic member presses a portion of an inner wall surface of the external cylinder part and a portion of an outer wall surface of the specimen holder axis part.

Further, in a preferred embodiment of a specimen holder according to the present invention, it is characterized in that a sealing power of the first seal part is larger than that of the second seal part.

Further, in a preferred embodiment of a specimen holder according to the present invention, it is characterized in that the seal part is made of polytetrafluoroethylene.

Further, in a preferred embodiment of a specimen holder according to the present invention, it is characterized in that the seal part has a groove at a side of a direction of a handle of the specimen holder, and has the elastic member within the groove.

Further, in a preferred embodiment of a specimen holder according to the present invention, it is characterized in that the elastic member is at least one selected from a blade spring, a leaf spring, a plate spring, an elastic rubber, a coil spring and a kick spring.

Further, in a preferred embodiment of a specimen holder according to the present invention, it is characterized in that the specimen holder further has an insulating part for insulating a heat set in between the first seal part and the step part.

Further, in a preferred embodiment of a specimen holder according to the present invention, it is characterized in that the specimen holder further has a stopper part for preventing the seal part from sifting.

Effect of Invention

According to the specimen holder of the present invention, it has an advantageous effect that it is possible to restrain a leak occurring on the holder axis even if the specimen holder axis moves backward and forward, or moves rotationally.

BRIEF DESCRIPTION OF THE DRAWINGS

FIG. 1 is a figure showing a sectional view of the specimen holder of one embodiment according to the present invention. FIG. 1(a) shows a status that a specimen setting part is pushed out from an external cylinder part by a handle portion (in the case that a specimen comes under observation), FIG. 1(b) shows a status that a specimen setting part is stored into an external cylinder part, FIG. 1(c) shows an enlarged view of a step part, FIG. 1(d) shows an enlarged view of a step part according to another embodiment.

FIG. 2 is a figure showing a sectional view of the specimen holder of one embodiment according to the present invention. This embodiment shows an example in the case of using a cooling means in order to be able to observe a specimen under a low temperature. FIG. 2(a) shows a status that a specimen setting part is pushed out from an external cylinder part by a handle portion (in the case that a specimen comes under observation), FIG. 2(b) shows a status that a specimen setting part is stored into an external cylinder part.

FIG. 3 shows a sectional view of the specimen holder of one embodiment according to the present invention. This embodiment shows an example of a specimen holder having a cooling means and capable of inclining in two axis.

MODE FOR CARRYING OUT THE INVENTION

A specimen holder according to the present invention is characterized by comprising a specimen holder axis part having a specimen and/or a specimen mesh setting part, an external cylinder part capable of housing the specimen holder axis part, and a seal part for sealing the specimen and/or the specimen mesh setting part from atmosphere wherein the seal part is set to a step part which is set to a portion of the external cylinder part. A constitution of a seal part set in a portion of an external cylinder part and set to a step part mounted inside of the external cylinder part makes it possible to shield the specimen and/or the specimen mesh setting part from atmosphere to seal regardless of a change of an environment. As a member of the seal part, a seal member capable of pressing both an inner wall of the external cylinder part and an outer wall of the specimen holder axis can be used. As long as seal member can press, the shape of the member of the seal part is not particularly limited, but for example, mention may be made of a U-shaped, a V-shaped and L-shaped etc. In a preferred embodiment, the seal part is able to have an elastic member and the elastic member can press a portion of an inner wall surface of the external cylinder part and a portion of an outer wall surface of the specimen holder axis part. Such constitution which can press makes it possible to seal regardless of a change of an environment. Moreover, the seal part can have a function of a roller bearing of the specimen holder.

Further, in a preferred embodiment of a specimen holder according to the present invention, it is characterized in that the seal part set to the step part is as a first seal part, further the specimen holder has a second seal part which exists in a tip part of the specimen holder and exists in a direction of a central axis of an electron microscope comparing to the specimen and/or the specimen mesh setting part. In addition to the first seal set to the step part, the existence of the second seal part existing in in a tip part of the specimen holder and exists in a direction of a central axis of an electron microscope comparing to the specimen and/or the specimen mesh setting part makes it possible to seal or shield the specimen and/or the specimen mesh setting part from atmosphere and to attain a function as a transfer holder. The second seal part is not particularly limited to, but an existing O-ring may be used. As discussed previously, the second seal part is also able to have an elastic member and the elastic member can press a portion of an inner wall surface of the external cylinder part and a portion of an outer wall surface of the specimen holder axis part. Moreover, the second seal part can be set to the specimen holder axis part or the external cylinder part, as long as it is possible to shield a specimen etc., from atmosphere.

Moreover, although the second seal part is not essential, but the existence of the second seal part has an advantages as follows. The second seal part can be enough if it is able to have a function of sealing until a specimen etc., is carried in the TEM. For example, after a specimen is delivered from a device of producing a specimen such as FIB (Focused Ion Beam), Nano Mill, or after a specimen is mounted in a glove box (which is a box for working under the conditions of shielding atmosphere, a specimen can be carried in the TEM under the conditions of shielding atmosphere. The ability of sealing for vacuum is not generally needed according to driving since it is possible to seal under the condition of vacuum or a space of argon gas, and further, the use of a general O-ring can be enough since a cooling is conducted during observation and the existence of the second seal member is no use when cooling.

Further, in a preferred embodiment of a specimen holder according to the present invention, it is characterized in that the seal part has an elastic member inside and the elastic member presses a portion of an inner wall surface of the external cylinder part and a portion of an outer wall surface of the specimen holder axis part. The pressure of the elastic member to both a portion of an inner wall surface of the external cylinder part and a portion of an outer wall surface of the specimen holder axis part makes it possible to seal firmly since the elastic member can keep pressing both a portion of an inner wall surface of the external cylinder part and a portion of an outer wall surface of the specimen holder axis part regardless of a change of environment such as under the condition of an extremely low temperature. A seal member capable of pressing both an inner wall surface of the external cylinder part and an outer wall surface of the specimen holder axis part does not exist up to now.

Further, it is possible to use the above seal part of the present invention having an elastic member inside wherein the elastic member presses a portion of an inner wall surface of the external cylinder part and a portion of an outer wall surface of the specimen holder axis part at everywhere a known O-ring of the prior art is used.

Further, in a preferred embodiment of a specimen holder according to the present invention, it is characterized in that a sealing power of the first seal part is larger than that of the second seal part. In particular, although the second seal part is not necessarily essential, this is because that if it is in the case that the second seal part is used, finally, the first seal part can shield atmosphere. In this embodiment, it is thought that an existing seal member is used as the second seal part, in order to seal it more completely, a power of sealing of the first seal part can be the same power as the second seal part. Moreover, a power of sealing of the second seal part may be large. This embodiment is also included in a range of the present invention as an example, although there are some issues that it locates in a tip of a specimen holder, and a more fine member is required, as a result of this, and a more detail work is required and thereby costs becoming high.

Further, in a preferred embodiment of a specimen holder according to the present invention, it is characterized in that the seal part is made of polytetrafluoroethylene. The seal part made of polytetrafluoroethylene has an extremely high cooling resistance as well as a high thermal insulation. Therefore, if the seal part is made by a member having a cooling resistance, it is possible to conduct an observation during cooling under the condition of being sealed firmly.

Further, in a preferred embodiment of a specimen holder according to the present invention, it is characterized in that the seal part has a groove at a side of a direction of a handle of the specimen holder, and has the elastic member within the groove. Such a constitution of setting elastic member into the groove makes it possible to press a portion of an inner wall surface of the external cylinder part and a portion of an outer wall surface of the specimen holder axis part and thereby sealing more firmly. In particular, a simultaneous use of both a seal member having a cooling resistance and an elastic member capable of pressing both a portion of an inner wall surface of the external cylinder part and a portion of an outer wall surface of the specimen holder axis part makes it possible to seal stably under several environment to shield it from atmosphere more firmly.

Further, in a preferred embodiment of a specimen holder according to the present invention, it is characterized in that the elastic member is at least one selected from a blade spring, a leaf spring, a plate spring, an elastic rubber, a coil spring and a kick spring. Further, in a preferred embodiment of a specimen holder according to the present invention, it is characterized in that the specimen holder further has an insulating part for insulating a heat set in between the first seal part and the step part. A function of the insulating part is as follows. That is, although a wall of receiving a seal set at a step part can fix a seal part, if the wall is a metal, since it transforms heat, for example, in such a case, it makes reduce an ability of cooling.

Therefore, from a viewpoint that it is sealed more firmly, a material used for the seal part can use those having a thermal insulation. Further, since a wall of receiving a seal set at a step part has a large touch area, there are possibilities that it transforms heat slightly. Therefore, the use of a member having a thermal insulation at a wall of a step part makes it possible to delay a thermal conduction and thereby working with advantage when cooling. Moreover, a member having a thermal insulation used for the wall is not particularly limited to as long as it is a member having a high thermal insulation, for example, mention may be made of at least one selected from a zirconia material, a polytetrafluoroethylene material, as well as a resin based material such as PEEK resin (polyether ether ketone resin), polyimide resin, an extreme thermophilic plastic (wholly aromatic polyimide resin) (Vespel (Registered trademark)). In addition to a high thermal insulation, it become more effective that a contact surface is also high thermal insulation. Since there are some possibility that a resin based material contains water to deflate, more preferably, as a member of a thermal insulation used for the wall, mention maybe made of those made of zirconia, or polytetrafluoroethylene.

Further, in a preferred embodiment of a specimen holder according to the present invention, it is characterized in that the specimen holder further has a stopper part for preventing the seal part from sifting. This is preferable in the case of fixing the seal part to seal it more stably.

Moreover, in a preferred embodiment of a specimen holder according to the present invention, it is characterized in that the specimen holder is applied for a specimen holder having a cooling system, for example, with the use of a liquid nitrogen.

The use of the above seal part of the present invention having an elastic member inside wherein the elastic member presses a portion of an inner wall surface of the external cylinder part and a portion of an outer wall surface of the specimen holder axis part, makes it possible to seal under the conditions of vacuum everywhere it is cooled by the liquid nitrogen other than the axis portion for sealing. For example, it is possible to use the above seal part of the present invention for a lip for pouring of a Dewar.

EXAMPLE

Here will be described an embodiment of the specimen holder of the present invention, the invention is not to be construed as being limited to the following examples. Further, without departing from the scope of the present invention, appropriately modified are of course possible.

Example 1

The following will be described an embodiment of the specimen holder of the present invention with reference to the drawings.

FIG. 1 is a figure showing a sectional view of the specimen holder of one embodiment according to the present invention. FIG. 1(a) shows a status that a specimen setting part is pushed out from an external cylinder part by a handle portion (in the case that a specimen comes under observation), FIG. 1(b) shows a status that a specimen setting part is stored into an external cylinder part, FIG. 1(c) shows an enlarged view of a step part, FIG. 1(d) shows an enlarged view of a step part according to another embodiment. In FIG. 1, 1 is a handle part, 2 is an external cylinder part of the specimen holder, 3 is a step part, 4 is a first seal part, 5 is a specimen holder axis, 6 is a second seal part, 7 is a specimen setting part, 8 is an elastic member, 9 is an insulating part for insulating a heat, 10 is a stopper part for preventing the seal part from sifting, 11 is a second step part, respectively.

Although FIG. 1(a) shows a status that a specimen setting part is pushed out from an external cylinder part by a handle portion (in the case that a specimen comes under observation) and a second seal part 6 is illustrated, however it is not necessarily needed. Although the second seal part 6 is a conventional O-ring, it may be a seal member capable of pressing both an inner wall surface of the external cylinder part and an outer wall surface of the specimen holder axis part, as shown by a first seal part 4. Although in Figure, an O-ring is set at a tip part, an O-ring may be mounted (set) to an inner and central (of the electron microscope) side of the external cylinder part of the specimen holder. Although the second seal part 6 is illustrated, for example, in the case of a specimen holder etc., with no use of transfer, the second seal may be not needed. Further, in Figure, as a shape of a seal part, U-shape is used to seal it by pressing both an inner wall surface of the external cylinder part and an outer wall surface of the specimen holder axis part. In a groove, the elastic member is mounted to seal it more firmly. After all, as long as it is possible to press both an inner wall surface of the external cylinder part and an outer wall surface of the specimen holder axis part, any shapes such as a U-shaped, a V-shaped and L-shaped etc., can be used. In addition to such a structure, the use of the elastic member makes it possible to seal it more firmly. FIG. 1(*b*) shows a status that a specimen setting part is stored into an external cylinder part. In this embodiment, since the specimen setting part 7 can be isolated with atmosphere completely, the embodiment is able to have a function as a transfer holder. In both FIG. 1(*a*) and FIG. 1(*b*), it is possible to maintain a status that a specimen is shielded from atmosphere in a structure wherein both sides of the specimen setting part 7 is completely sealed. Moreover, although it is not shown in figure, in order to insert the specimen holder axis smoothly, it is possible to add the other member within a range that does not interfere with the effect of pressing. For example, although it is not shown in figure, since a vibration should be avoided for a TME holder as much as possible, when observing (a status of pushing out the tip of the specimen holder), it is possible to have a member of controlling a vibration of a tip part, a ring of a roller baring, or a member of supporting three points. Further, in order to insert it smoothly when taking out and putting in the specimen holder axis part, a sleeve of a roller baring contacting by a vibration, or an O-ring, or a hardball for a thrust can be used.

FIG. 1(*c*) shows an enlarged view of a step part, as long as it is possible to press both an inner wall surface of the external cylinder part and an outer wall surface of the specimen holder axis part, although any shapes such as a U-shaped, a V-shaped and L-shaped etc., can be used, this Figure shows an example of the case that a blade spring 8 as the elastic member is mounted to the seal part. Thanks to the blade spring 8, it is possible to press both an inner wall surface of the external cylinder part and an outer wall surface of the specimen holder axis part strongly and thereby producing a more strong power of sealing. FIG. 1(*d*) shows an enlarged view of a step part according to another embodiment, it is an embodiment wherein an insulating part for insulating a heat 9 or a stopper part 10 are further mounted. The insulating part for insulating a heat makes it possible to suppress a transmission of heat from the seal part to the external cylinder part as much as possible. In figure, although the insulating part is set only to the step part, it is possible to be set to a side of the external cylinder part. Moreover, regarding the external cylinder part, since a contact place contacting the seal part and the external cylinder part is practically one point, there is no need to worry about a thermal insulation. It is possible to fix a stopper part 10 by turning off the screw. It is possible to control an extent of holding a seal by means of a tightness of a nut or a screw. The use of a step 11 makes it possible to attain a structure designed so that a seal is not broke down by over-tightening of the screw. The stopper part 10 makes it possible to fix the seal part more firmly. Moreover, although it is difficult to understand in Figure, the seal part 4 becomes a ring-shaped. In the same manner, the seal part 6 also becomes a ring-shaped.

FIG. 2 is a figure showing a sectional view of the specimen holder of one embodiment according to the present invention. This embodiment shows an example in the case of using a cooling means in order to be able to observe a specimen under a low temperature. FIG. 2(*a*) shows a status that a specimen setting part is pushed out from an external cylinder part by a handle portion (in the case that a specimen comes under observation), FIG. 2(*b*) shows a status that a specimen setting part is stored into an external cylinder part. In FIG. 2, 1 is a handle part, 2 is an external cylinder part of the specimen holder, 3 is a step part, 4 is a first seal part, 5 is a specimen holder axis, 6 is a second seal part, 7 is a specimen setting part, 10 is a stopper part for preventing the seal part from sifting, 20 is a cooling means, 21 is a seal part, 22 is a collet for a thermal conductance, respectively. In this embodiment, as a seal member capable of pressing both an inner wall surface of the external cylinder part and an outer wall surface of the specimen holder axis part, those of a U-shaped was used. Moreover, although the stopper part 10 is shown in Figure, it is not necessarily needed. Moreover, although it is difficult to understand in Figure, the seal part 4 becomes a ring-shaped. In the same manner, the seal part 6 and 21 also become a ring-shaped.

A cooling medium cooled by a cooling means can be used. For example, in the case of the use of liquid nitrogen, when a normal O-ring is used in a general method, since the O-ring becomes hard at a temperature of the liquid nitrogen and thereby reducing a temperature to contract a metal, it is impossible to seal for vacuum (to seal externally), in a specimen holder at a temperature of the liquid nitrogen.

However, if a material having a cooling resistance such as those made of polytetrafluoroethylene is used as a seal member, since a member made of polytetrafluoroethylene has a cooling resistance until −200° C. or less, an ability of sealing becomes superior under the condition of the liquid nitrogen. Moreover, if an elastic member such as a blade spring is mounted inside of the seal part, since it is possible to press constantly by the spring even if the seal axis contracts, it is possible to seal for vacuum under the condition at a temperature of the liquid nitrogen and thereby making the specimen holder axis part move backward and forward, or move rotationally, under the condition of sealing in vacuum. In the case of the use of a blade spring or a spring, since it is possible to press the specimen holder axis uniformly, this makes it possible to attain a function of a roller bearing. Further, since a little leak can be suppressed when taking out and putting in the specimen holder axis, only the use of the first seal part makes it possible to (transfer and) shield from atmosphere with a high precision. Further, since a little leak can be suppressed when taking out and putting in the specimen holder axis, the use of the method of using the first seal part makes it possible to (transfer and) shield from atmosphere with a high precision and to maintain the condition under vacuum when conducting a beta incline operation.

Such a use of the seal member capable of pressing both an inner wall surface of the external cylinder part and an outer wall surface of the specimen holder axis part makes it possible to apply to the holder for the electron microscope such as a transmission type etc., to (transfer and) shield from atmosphere or to conduct a two axis incline operation as mentioned below and thereby having an advantage to a great extent.

FIG. 3 shows a sectional view of the specimen holder of one embodiment according to the present invention. This embodiment shows an example of a specimen holder having a cooling means and capable of inclining in two axis. In FIG. 3, 1 is a handle part, 2 is an external cylinder part of the specimen holder, 3 is a step part, 4 is a first seal part, 5 is a specimen holder axis, 6 is a second seal part, 7 is a specimen setting part, 10 is a stopper part for preventing the seal part from sifting, 20 is a cooling means, 21 is a seal part, 22 is a collet for a thermal conductance, 23 is a direction of inclining in Y axis, 24 is a direction of rotating an axis during cooling, respectively. In this figure, although it is not illustrated, a seal part can be mounted in a tip part of the specimen holder axis. Further, in an embodiment capable of inclining in two axis, it is also possible to store the specimen setting part 7 into the external cylinder part.

As just described, applying a seal member capable of pressing both an inner wall surface of the external cylinder part and an outer wall surface of the specimen holder axis part, such as a U-shaped seal to the specimen holder for the electron microscope as shown in Figure, makes it possible to restrain a leak from the holder axis. Further, the application of the elastic member such as a blade spring to the seal member makes it possible to restrain a leak from the holder axis much further. According to this, since a blade spring is mounted constantly, a blade spring makes it possible to impose on a seal surface constantly. Therefore, if it is in the case of a twist or a poor machining accuracy, there are no leaks occurred by a declination of the axis including a small leak.

Furthermore, it have been recognized that a cooling specimen holder with the use of the structure of the present invention has the following effects. That is, although in the prior art, a leak from the axis occurs because a diameter of the holder axis and an O-ring are constricted by cooling to occur a gap, the use of a seal member capable of pressing both the inner wall of the external cylinder part and an outer wall of the specimen holder axis part makes it possible to prevent a leak from the axis from occurring. Further, although in the prior art, although there are some problems that a roller bearing do not work because a diameter of the holder axis and an O-ring are constricted by cooling, it has been recognized that the constitution of the present invention makes it possible to resolve the problems. Further, it is possible to attain the roller bearing during cooling. Therefore, the present invention has an advantage effect that it is possible to stop the vibration of the tip part of the holder.

Moreover, it have been recognized that a two axis specimen holder with the use of the structure of the present invention has the following effects. That is, since there are no problems concerning a twist of an O-ring set on the specimen holder axis, the present invention has an advantage effect that it is possible to restrain a leak from the specimen holder axis. Moreover, regarding a cooling transfer, a demand of the use of the transfer holder in combination with the cooling holder becomes high consequently. However, in the prior art, a storage chamber has been needed since a cooling holder was cooled to a very low temperature and the specimen holder axis part was also cooled to a low temperature and thereby it being impossible to maintain a seal under the condition of a vacuum at an axis part because of a shrinkage of the axis and the O-ring, or a loss of an elasticity of the O-ring. The use of the construction of the present invention there is an advantage effect that it is possible to reduce a stroke for storing a specimen segment as shown in Figure, even if it is under the condition of cooling. That is, it have been recognized that the present invention can obtain a considerably innovative effect that it is possible to attain a compact structure for storing. Therefore, the use of the present invention makes it possible to attain easily a transfer holder with a cooling function.

INDUSTRIAL APPLICABILITY

Since the specimen holder of the present invention makes it possible to seal more firmly regardless of a change of environment, it is expected that the invention is beneficial in the field of in large ranges.

DESCRIPTION OF THE REFERENCE NUMERALS

1 a handle part
2 an external cylinder part of the specimen holder
3 a step part
4 a first seal part
5 a specimen holder axis
6 a second seal part
7 a specimen setting part
8 an elastic member
9 an insulating part for insulating a heat
10 a stopper part for preventing the seal part from sifting
11 a second step part
20 a cooling means
21 a seal part
22 a collet for a thermal conductance
23 a direction of inclining in Y axis
24 a direction of rotating an axis during cooling

What is claimed is:

1. A specimen holder characterized by comprising a specimen holder axis part having a specimen and/or a specimen mesh setting part, an external cylinder part capable of housing the specimen holder axis part, and a seal part for sealing the specimen and/or the specimen mesh setting part from atmosphere wherein the seal part is set to a step part which is set to a portion of the external cylinder part.

2. A specimen holder according to claim 1, wherein the seal part set to the step part is as a first seal part, further the specimen holder has a second seal part which exists in a tip part of the specimen holder and exists in a direction of a central axis of an electron microscope comparing to the specimen and/or the specimen mesh setting part.

3. A specimen holder according to claim 2, wherein the seal part has an elastic member inside and the elastic member presses a portion of an inner wall surface of the external cylinder part and a portion of an outer wall surface of the specimen holder axis part.

4. A specimen holder according to claim 3, wherein the seal part has a groove at a side of a direction of a handle of the specimen holder, and has the elastic member within the groove.

5. A specimen holder according to claim 3, wherein the elastic member is at least one selected from a blade spring, a leaf spring, a plate spring, an elastic rubber, a coil spring and a kick spring.

6. A specimen holder according to claim 2, wherein a sealing power of the first seal part is larger than that of the second seal part.

7. A specimen holder according to claim 2, wherein the specimen holder further has an insulating part for insulating a heat set in between the first seal part and the step part.

8. A specimen holder according to claim 1, wherein the seal part is made of polytetrafluoroethylene.

9. A specimen holder according to claim 1, wherein the specimen holder further has a stopper part for preventing the seal part from sifting.

* * * * *